United States Patent [19]

Gardner et al.

[11] Patent Number: 5,296,411
[45] Date of Patent: Mar. 22, 1994

[54] METHOD FOR ACHIEVING AN ULTRA-RELIABLE THIN OXIDE USING A NITROGEN ANNEAL

[75] Inventors: Mark I. Gardner, Red Rock; Henry J. Fulford, Jr., Austin, both of Tex.

[73] Assignee: Advanced Micro Devices, Inc., Sunnyvale, Calif.

[21] Appl. No.: 54,324

[22] Filed: Apr. 28, 1993

[51] Int. Cl.$^5$ ............................................. H01L 21/02
[52] U.S. Cl. ...................................... 437/238; 437/52; 437/10; 437/45; 437/247; 437/979; 437/983
[58] Field of Search ................. 437/238, 10, 45, 247, 437/52, 979, 983

[56] References Cited

U.S. PATENT DOCUMENTS

| | | | |
|---|---|---|---|
| 4,744,197 | 10/1988 | Haddad | 437/27 |
| 4,784,975 | 11/1988 | Hofmann et al. | 437/238 |
| 4,894,353 | 1/1990 | Ibok | 437/52 |
| 5,077,230 | 12/1991 | Woo et al. | 437/69 |
| 5,210,056 | 5/1993 | Pong et al. | 437/247 |
| 5,215,934 | 6/1993 | Tzeng | 437/45 |
| 5,219,774 | 6/1993 | Vasché | 437/52 |
| 5,225,355 | 7/1993 | Sugino et al. | 437/10 |

FOREIGN PATENT DOCUMENTS 0148088 2/1992 Japan .................... 437/238

Primary Examiner—Tom Thomas
Assistant Examiner—Trung Dang
Attorney, Agent, or Firm—Skjerven, Morrill, MacPherson, Franklin & Friel

[57] ABSTRACT

A high-quality tunnel oxide, suitable for EEPROM devices, is formed upon a surface region of a semiconductor body over a heavily-doped N+ layer by first oxidizing the semiconductor body to form an oxide upon the surface region of the semiconductor body over the heavily-doped N+ layer. Next, the semiconductor body is annealed, under a gettering ambient, to densify the oxide and to dope the oxide at its surface and for a portion thereinto near its surface with a gettering agent. The semiconductor body is then oxidized, under an oxidizing ambient, to thicken the oxide, after which it is annealed for a second time, this time under an oxidizing ambient containing nitrogen, to further thicken the oxide and to form a surface layer therein containing a concentration of nitrogen. Tunnel oxides thus fabricated exhibit dramatically improved time-to-breakdown characteristics compared to tunnel oxides processed without such a nitrogen anneal. Furthermore, gate oxides formed earlier in a process sequence, but receiving the same nitrogen anneal, also exhibit markedly improved time-to-breakdown characteristics, as well as substantially improved threshold stability in response to a fixed current passed through the gate oxide.

25 Claims, 6 Drawing Sheets

METHOD FOR ACHIEVING AN ULTRA-RELIABLE THIN OXIDE USING A NITROGEN ANNEAL

BACKGROUND OF THE INVENTION

1. Field of the Invention

This invention relates to the fabrication of semiconductor devices, and more specifically, to methods for achieving a high quality oxide on the surface of a semiconductor substrate.

2. Description of Related Art

The importance of high quality oxides in the fabrication of semiconductor devices cannot be overemphasized. Many broad categories of commercial devices, such as Electrically Erasable Programmable Read-Only Memories (EEPROMS), Dynamic Random Access Memories (DRAMs), and more recently, even high-speed basic logic functions, owe their commercialization to the reproducibility of high quality, very thin oxide layers.

Major improvements in gate oxide quality have been achieved by improved cleaning techniques, the addition of HCL/TCA to the gate oxidation process, and higher purity gasses and chemicals. RCA cleaning techniques are described in "Dependence of Thin Oxide Quality on Surface Micro-Roughness" by T. Ohmi, et. al., IEEE Transactions on Electron Devices, Vol. 39, Number 3, March 1992. Other techniques have incorporated different gas ($NH_3$, ONO, WET $O_2$) schemes in the gate oxidation cycle other than the conventional $O_2$ with HCL or TCA. Also considerable progress has been made with single wafer RTA gate processing, as is described in "Effect of Rapid Thermal Reoxidation on the Electrical Properties of Rapid Thermally Nitrided Thin-Gate Oxides", by A. Joshi, et. al., IEEE Transactions on Electron Devices, Vol. 39, Number 4, April 1992.

These techniques refer to "gate oxides" as in the gate of an MOS transistor, but are usually applicable to any thin (usually less than 300 Å) oxide. The "tunnel" oxide of an EEPROM process technology is a very thin gate oxide (usually less than 100 Å), with the somewhat unusual requirement that it be grown above a very heavily doped N+ layer. Oxides grown from heavily doped substrate surfaces are generally considered to be lower in quality than those grown from more lightly doped surfaces, as would be the case for the transistor channel region of most MOS transistor processes.

Despite the care taken in forming thin oxides, further quality improvement is desirable.

SUMMARY OF THE INVENTION

It is an object of the present invention to improve the quality of a thin oxide layer.

It is an additional object of the present invention to improve the quality of a tunnel oxide for an EEPROM.

It is a further object of the present invention to improve the quality of a gate oxide for an MOS transistor.

It is yet a further object of the present invention to provide an environment for forming a thin oxide using a relatively low oxidation temperature.

It is still a further object of the present invention to produce a highly manufacturable, reproducible thin oxide.

In one embodiment of the present invention, a method for forming a high quality oxide upon a surface region of a semiconductor body includes the step of oxidizing the semiconductor body under an oxidizing ambient a first time to form a first oxide layer upon the surface region. The first oxide layer is then annealed under a gettering ambient, to densify the first oxide layer and to dope the first oxide layer at its surface, and for a portion thereinto near its surface, with a gettering agent. Next, the semiconductor body is oxidized under an oxidizing ambient a second time to form a second oxide layer upon the first oxide layer. Lastly, the second oxide layer is annealed under an oxidizing ambient containing nitrogen, thereby forming a third oxide layer upon the second oxide layer, the third oxide layer containing a concentration of nitrogen. The first, second, and third oxide layers together form a high quality oxide.

In another embodiment of the current invention suitable for EEPROM devices, a method for forming a high-quality tunnel oxide upon a surface region of a semiconductor body over a heavily-doped N+ layer therein includes forming a heavily-doped N+ layer in the semiconductor body, followed by oxidizing the semiconductor body under an oxidizing ambient a first time to form an oxide upon a surface region of the semiconductor body over the heavily-doped N+ layer. There next follows annealing the semiconductor body under a gettering ambient a first time, subsequent to the first oxidizing step, to densify the oxide and to dope the oxide at its surface and for a portion thereinto near its surface with a gettering agent. Then, the semiconductor body is oxidized under an oxidizing ambient for a second time, subsequent to the first annealing step, to thicken the oxide, and then annealed under an oxidizing ambient containing nitrogen for a first time, subsequent to the second oxidizing step, thereby further thickening the oxide and forming a surface layer therein containing a concentration of nitrogen.

DETAILED DESCRIPTION OF THE PREFERRED EMBODIMENTS

FIGS. 1-7 are cross-sectional views illustrating a sequence of process steps for forming gate and tunnel oxides in a P-well active area of a CMOS EEPROM process. The gate oxide is used to fabricate N-channel MOS transistors, and the tunnel oxide is used to fabricate a structure useful to an EEPROM cell element.

Figure 1:
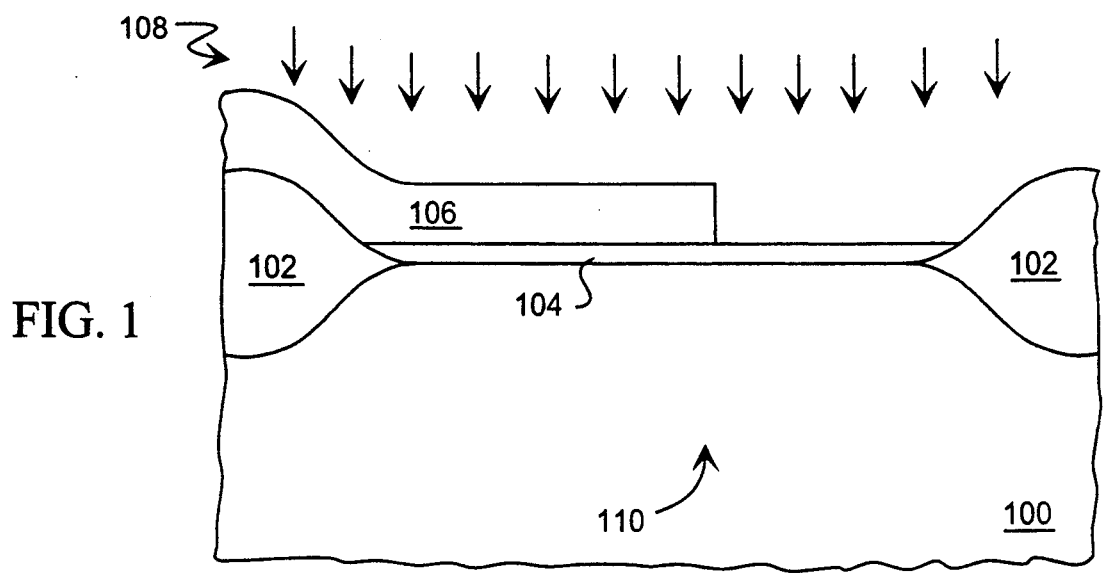
FIGS. 1-7 are cross-sectional views illustrating a sequence of process steps for forming gate and tunnel oxides in a P-well active area of a CMOS EEPROM process.
Figure 2:
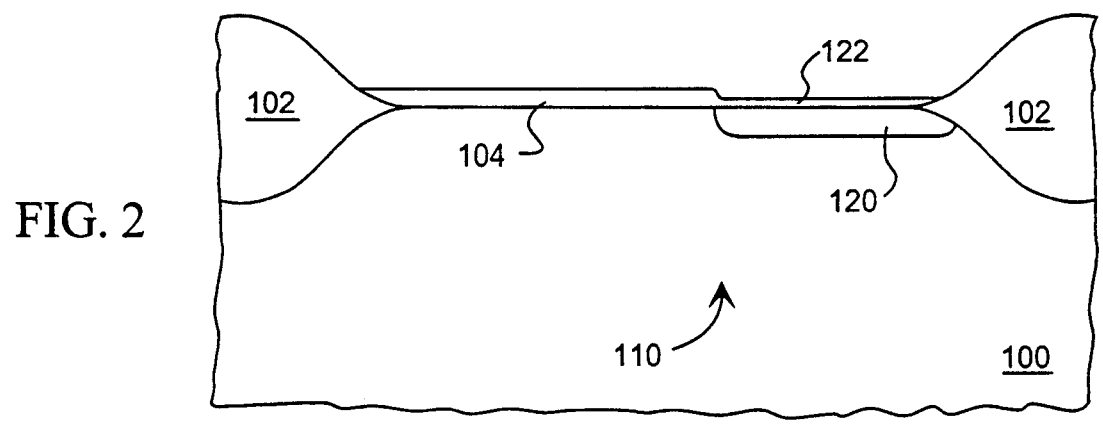

Referring to FIG. 1, P-well field oxides 102 are formed using a LOCOS process upon substrate 100. P-well field oxides 102 define a P-well active area 110 between the field oxides 102. KOOI oxide 104 then is grown in a steam oxidation environment to a thickness of approximately 300 Å. The growing and subsequent removing of KOOI oxide is a well known procedure for eliminating the remnant KOOI ribbon of nitride which forms around the active area at the LOCOS edge during the previous field oxidation. (Silicon nitride in a steam oxidation environment decomposes into ammonia and silicon dioxide. The ammonia diffuses down through the field oxide until reaching the silicon surface, where it reacts to form a silicon nitride, and leaving a ribbon of nitride at the silicon/silicon dioxide interface around the edge of the active area.) Photoresist then is applied and defined to form photoresist layer 106 which exposes a portion of the KOOI oxide 104 over the P-well active area 110.

Next, a phosphorus implant 108 is implanted through the exposed KOOI oxide and into the substrate 100 in the P-well active area 110 for the EEPROM process of this embodiment. Other regions of the substrate are masked by the photoresist layer 106. Photoresist layer 106 is then removed and the surface is prepared for annealing by an RCA clean operation, resulting in the structure shown in FIG. 2. Phosphorus implant layer 120 has been created by the heavy dose of the phosphorus implant 108. Due to the implant damage to the KOOI oxide which was exposed to the phosphorus implant 108, the RCA clean operation etches some of the implant-damaged KOOI oxide, resulting in etched KOOI oxide 122 approximately 100 Å thick in the region above phosphorus implant layer 120. KOOI oxide 104 which was formerly protected by photoresist layer 106 and consequently not damaged by phosphorus implant 108 remains substantially unetched at 300 Å thick.

Figure 3:
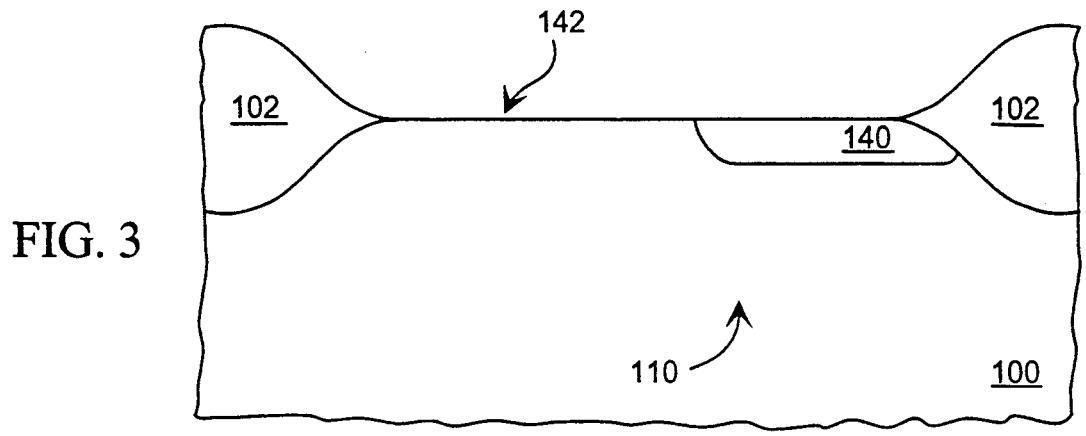
Figure 4:
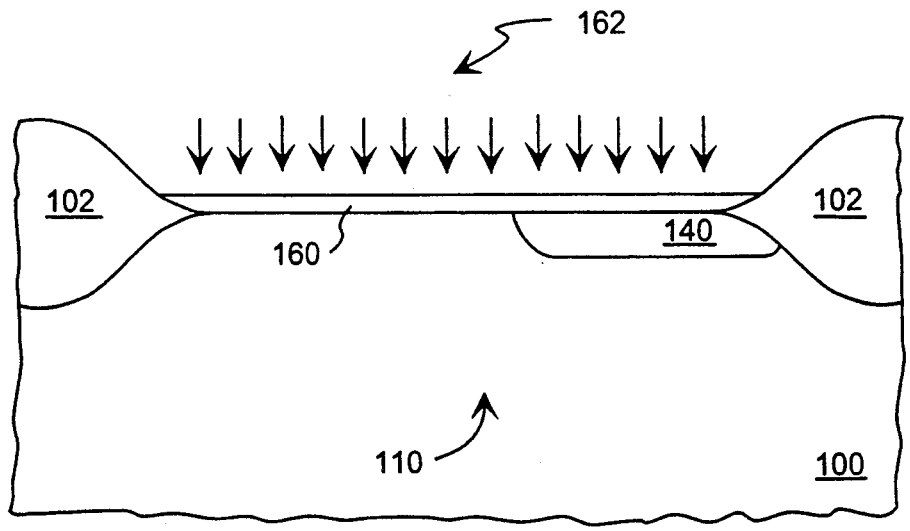

An anneal operation follows which both drives the phosphorus implant layer 120 into the substrate 100, thereby lowering the surface concentration of phosphorus, and activates the phosphorus implant, thereby forming an N+ layer in the P-well. Next, a short oxide etch (e.g., 1.7 minutes in 10:1 HF) removes the remaining KOOI oxide 104 and etched KOOI oxide 122 from the surface of the P-well in preparation for gate oxidation. Preferable etch conditions for this pre-gate oxidation etch step are discussed in copending, commonly assigned U.S. patent application Ser. No. 07/969,708, filed on Oct. 29, 1992, which names Mark I. Gardner, Henry Jim Fulford, Jr., and Jay J. Seaton as inventors and is entitled "Method for Achieving a High Quality Thin Oxide in Integrated Circuit Devices", which application is incorporated herein by reference in its entirety. The resulting structure is shown in FIG. 3, and shows P-well active area surface 142 free of overlying oxide, and further shows the formation of N+ layer 140, being deeper and broader than the previous unactivated phosphorus implant layer 120 due to the drive in accomplished during the previous anneal step.

Next, a gate oxide is formed over the P-well active area 110. This is grown in a dry oxidation environment and results in the structure of FIG. 4. Gate oxide 160 is approximately 225 Å thick. An in-situ anneal is preferably performed at the conclusion of the gate oxidation cycle by changing the ambient gases in the oxidation furnace to an inert annealing ambient, while continuing to apply a high temperature (e.g., 1000° C. for 30 minutes in Argon). Preferable gate oxidation conditions are discussed in copending, commonly assigned U.S. patent application Ser. No. 07/959,230, filed on Oct. 9, 1992, which names Mark I. Gardner and Henry Jim Fulford, Jr. as inventors and is entitled "Method for Achieving a High Quality Thin Oxide Using a Sacrificial Oxide Anneal", which application is incorporated herein by reference in its entirety.

$V_{TI}$ Implant 162 is then implanted over the whole wafer to set the nominal threshold of MOS transistors to be fabricated later in the P-wells. This is preferably a light boron implant which is applied without any masking photoresist (i.e. a "blanket implant") to both P-well regions and N-well regions (not shown). A separate $V_{TP}$ implant (not shown) is then implanted into the N-well regions (not shown) to adjust the threshold of P-channel MOS transistors to be fabricated later in the N-wells. To accomplish this, a photoresist layer is applied and defined to cover the P-wells while exposing the N-wells, the implant into the N-wells is performed, and the photoresist overlying the P-wells then removed.

Figure 5:
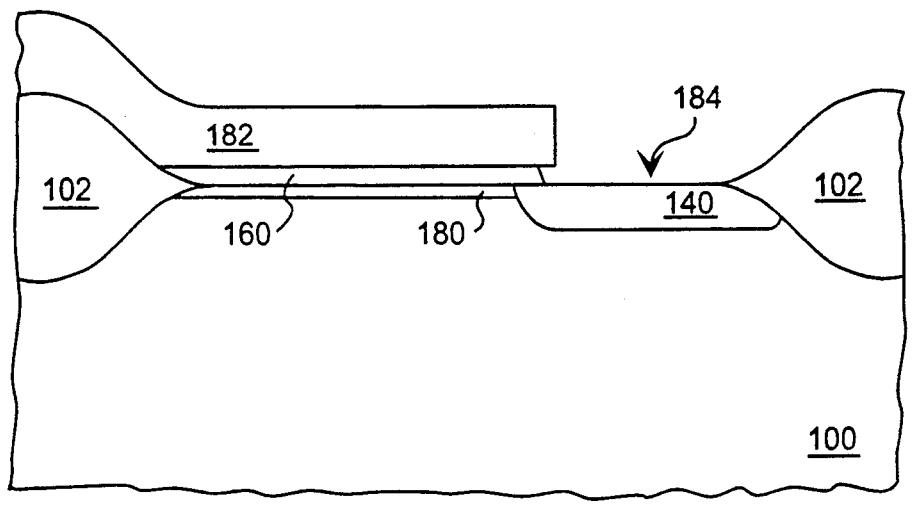
Figure 6:
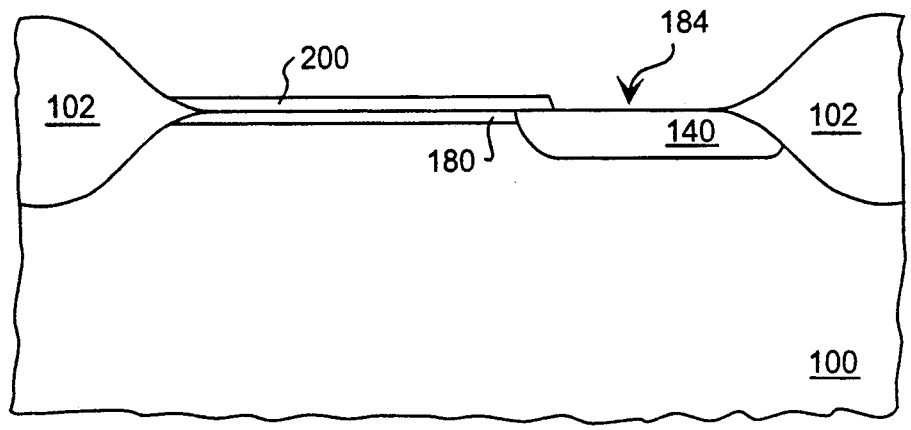

Continuing with the process sequence as affects the P-well shown, a photoresist layer is applied and defined to expose the gate oxide 160 over the N+ layer 140, followed by an etch step to remove the exposed gate oxide. This Tunnel Opening etch may be a 0.2 minute etch in a 6:1 buffered oxide etchant, and removes the 225 Å of gate oxide to expose the surface of the substrate over the N+ layer 140. Preferable conditions for this etch are discussed in the above-referenced patent application entitled "Method for Achieving a High Quality Thin Oxide in Integrated Circuit Devices" (Ser. No. 07/969,708). The resulting structure is shown in FIG. 5 and shows the N+ surface 184 exposed by the tunnel opening etch. Photoresist layer 182 defines the tunnel opening and protects the remainder of gate oxide 160 not overlying N+ layer 140. The as-yet unactivated $V_{TI}$ implant layer 180 is shown under the gate oxide 160. $V_{TI}$ implant layer 180 is not shown extending into N+ layer 140 because the doping density of N+ layer 140 is far greater than that of $V_{TI}$ implant layer 180.

Next, the photoresist layer 182 is removed and an additional etch operation is performed for 50 seconds in 50:1 HF to reduce the thickness of gate oxide 160 from 225 Å down to approximately 140 Å. Preferable etch conditions are discussed in the above-referenced patent application entitled "Method for Achieving a High Quality Thin Oxide in Integrated Circuit Devices" (Ser. No. 07/969,708), and results in the structure shown in FIG. 6. Etched gate oxide 200 is approximately 140 Å thick. This etch also serves to remove any native oxide formed over N+ surface 184 subsequent to the etching of gate oxide 160.

Figure 7:
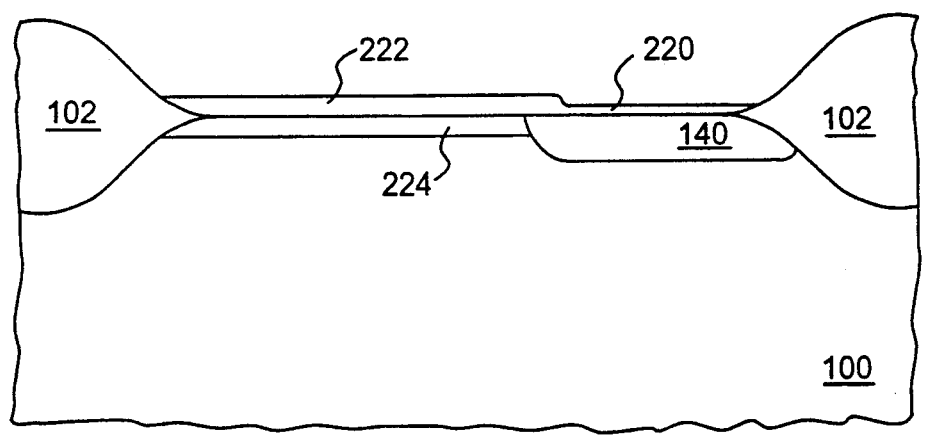

Lastly, an oxidation sequence as described in Table 1 both grows a tunnel oxide from N+ surface 184 over N+ layer 140, and increases the thickness of the existing etched gate oxide 200. As is shown, the tunnel oxidation proceeds as a three-stage oxidation cycle, with HCl gettering performed between the first and second stages, and again between the second and third stages. This procedure keeps the HCl away from both the silicon and the polysilicon interfaces, while still providing a high enough HCl concentration within the body of the gate oxide to getter any mobile ionic charge or heavy metals that may be present. HCl coming into contact with either a silicon or polysilicon interface will degrade that interface surface, and likewise degrade any oxide contiguous to that surface. Additionally, the gettering steps provide an annealing environment for the partially-grown oxide which serves to reduce roughness at the Si/SiO$_2$ interface and to densify the oxide, both of which are useful in promoting a high quality oxide. After the third stage of oxidation, there follows a ramp-down in temperature. Referring to FIG. 7, tunnel oxide 220 is nominally 87 Å thick, while reoxidized gate oxide 222 is now nominally 180 Å thick. The unactivated $V_{TI}$ implant layer 180 has been activated by the tunnel oxidation sequence, resulting in $V_{TI}$ layer 224.

TABLE 1

Tunnel Oxidation Sequence

| STEP | GASSES | TEMP | TIME |
|---|---|---|---|
| I. Push/Stabilize | Ar | Ramp to 800° C. Final Temp | t = 28 min. |
| II. Ramp to 850 | Low O₂/Ar | 850° C. Final Temp | t = 10 min. |
| III. Oxidation | O₂ | 850° C. | t = 12 min. |
| IV. HCl Getter | HCl/Ar | 850° C. | t = 5 min. |
| V. Oxidation | O₂ | 850° C. | t = 12 min. |
| VI. HCl Getter | HCl/Ar | 850° C. | t = 5 min. |
| VII. Oxidation | O₂ | 850° C. | t = 12 min. |
| VIII. Ramp to 800 | Ar | 800° C. Final Temp | t = 16 min. |
| IX. Pull/Stabilize | Ar | less than 500° C. | t = 31 min. |

Subsequent to this step a polysilicon layer is deposited, doped, and defined to form, in accordance with any of a variety of well-known processes, transistors, interconnect, and other features. In particular, the polysilicon is deposited above tunnel oxide 220 to form a structure useful to an EEPROM cell which conducts current through tunnel oxide 220 if the electric field across the tunnel oxide 220 is high enough. Measurements of oxide quality can be made immediately after the polysilicon layer is patterned into useful structures.

We have found that annealing the tunnel oxide in an ambient environment which includes a source of nitrogen, and which therefore results in a surface layer of the tunnel oxide containing a percentage of nitrogen, greatly improves the integrity of the tunnel oxide. We have also found that the addition of such an anneal step in the tunnel oxidation sequence improves the quality of a gate oxide which is further oxidized and thickened by the tunnel oxidation sequence.

To investigate the quantitative effects on tunnel oxide quality, a study was conducted using wafers fabricated using the process flow of FIGS. 1-7. A tunnel oxidation sequence including an N₂O anneal, as described in Table 2, was used to grow tunnel oxides which were compared with tunnel oxides fabricated using the tunnel oxidation sequence described in Table 1.

TABLE 2

Enhanced Tunnel Oxidation Sequence

| STEP | GASSES | TEMP | TIME |
|---|---|---|---|
| I. Push/Stabilize | Ar | Ramp to 800° C. Final Temp | t = 28 min. |
| II. Ramp to 850 | Low O₂/Ar | 850° C. Final Temp | t = 10 min. |
| III. Oxidation | O₂ | 850° C. | t = 12 min. |
| IV. HCL Getter | HCl/Ar | 850° C. | t = 5 min. |
| V. Oxidation | O₂ | 850° C. | t = 2.5 min. |
| VI. HCL Getter | HCl/Ar | 850° C. | t = 5 min. |
| VII. Oxidation | O₂ | 850° C. | t = 2.5 min. |
| VIII. Ramp to 800 | N₂ or Ar | 800° C. Final Temp | t = 16 min. |
| IX. Pull/Stabilize | N₂ or Ar | less than 500° C. | t = 31 min. |
| X. RTA anneal | N₂O | 1050° C. | t = 10 sec. |

As before, the tunnel oxidation proceeds as a three-stage oxidation cycle, with HCl gettering performed between the first and second stages, and again between the second and third stages. After the third stage of oxidation and a ramp-down in temperature, a rapid thermal anneal (RTA anneal) is performed in an N₂O ambient environment. Compared to the oxidation sequence of Table 1, the second and third oxidation times are adjusted such that approximately 60 Å of tunnel oxide is formed by the end of the third oxidation step (step VII in Table 2). The first oxidation step (step III in Table 2) remains at 12 minutes as before to ensure an adequate thickness of oxide covers the substrate before the introduction of the HCl during the first gettering step, in order to prevent the HCl from contacting the silicon surface. The N₂O anneal step forms approximately another 15 Å of oxide, resulting in a final thickness of approximately 75 Å. Steps I-IX of Table 2, which include the oxidation and gettering steps, are preferably performed in a diffusion tube, while step X is, of course, preferably performed in an RTA system. Nonetheless, the final anneal (step X) can also be performed in a diffusion tube, if desired. Earlier doping profiles may need to be adjusted due to the high thermal mass of the tube and the resultant additional time at high temperature a wafer would experience compared to an RTA anneal.

To determine the effects of the tunnel oxide annealing step on the quality of tunnel oxides grown from the P-well surface, time-to-breakdown measurements were made on structures using the tunnel oxide. Time-to-breakdown is measured by forcing a constant current through the oxide under test (which conducts via Fowler-Nordheim tunneling), and noting the time at which the oxide breaks down electrically. Breakdown occurs due to the trapping of charge within the oxide, thereby gradually raising the electric field across the oxide until the oxide can no longer withstand the induced voltage. Higher quality oxides will trap less charge over time, and will therefore take longer to break down. (The mathematical product of the forcing current times the measured time-to-breakdown gives rise to a charge value, known as $Q_{BD}$, corresponding to the total charge passed through the oxide prior to breakdown.) Higher time-to-breakdown values, for a given current density, reflect higher quality oxides.

Figure 8:
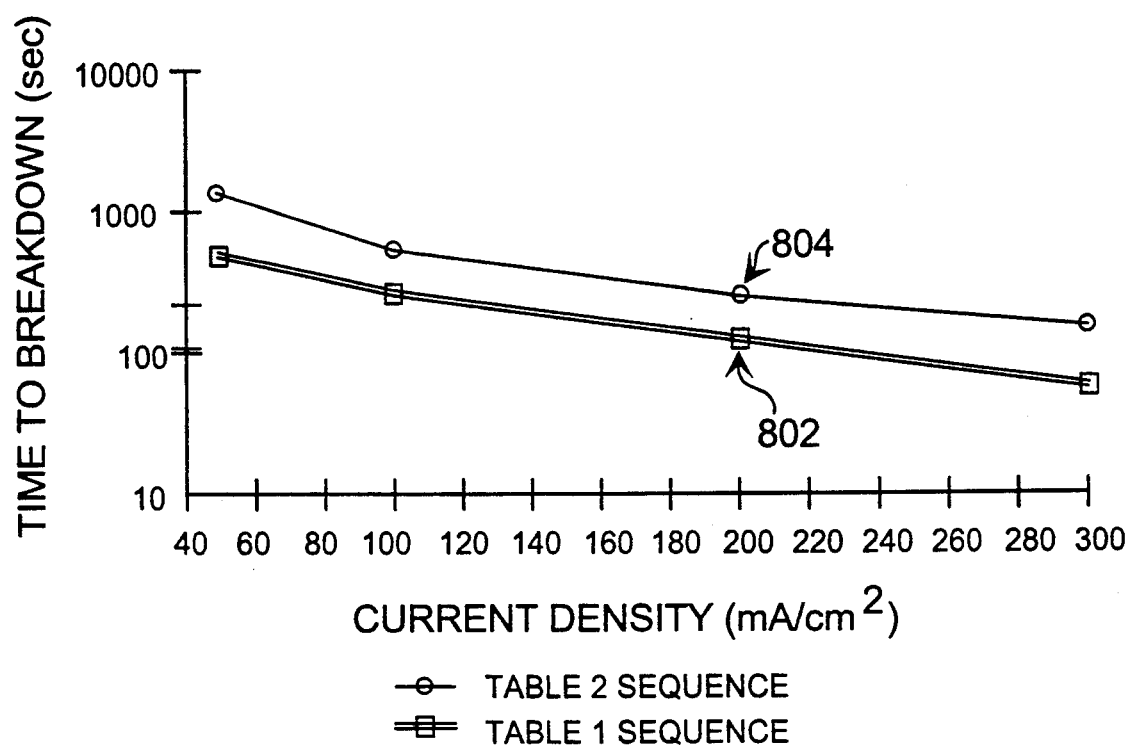
FIG. 8 is a chart which plots time-to-breakdown measurements for two different gate oxides fabricated over a P-substrate region according to the process sequence of FIGS. 1-7.

FIG. 8 shows a plot of time-to-breakdown versus current density for two different gate oxides fabricated upon the semiconductor surface overlying a P substrate region (a region of the P-well active area 110 not having an N+ layer 140 underlying the surface). This region corresponds to the channel region of a transistor. At four different current densities, a gate oxide fabricated using the process sequence shown in FIG. 1-7 and using the tunnel oxide sequence of Table 1, and a gate oxide fabricated similarly but using the tunnel oxide sequence of Table 2, were each measured for time-to-breakdown. A 100% improvement was observed at all four current densities. For example, at a current density of 200 mA/cm², the measured time-to-breakdown was 105 seconds for the tunnel oxide fabricated using the sequence of Table 1 (data point 802), and yet virtually doubled to 200 seconds for the tunnel oxide fabricated using the sequence of Table 3 (data point 804).

Figure 9:
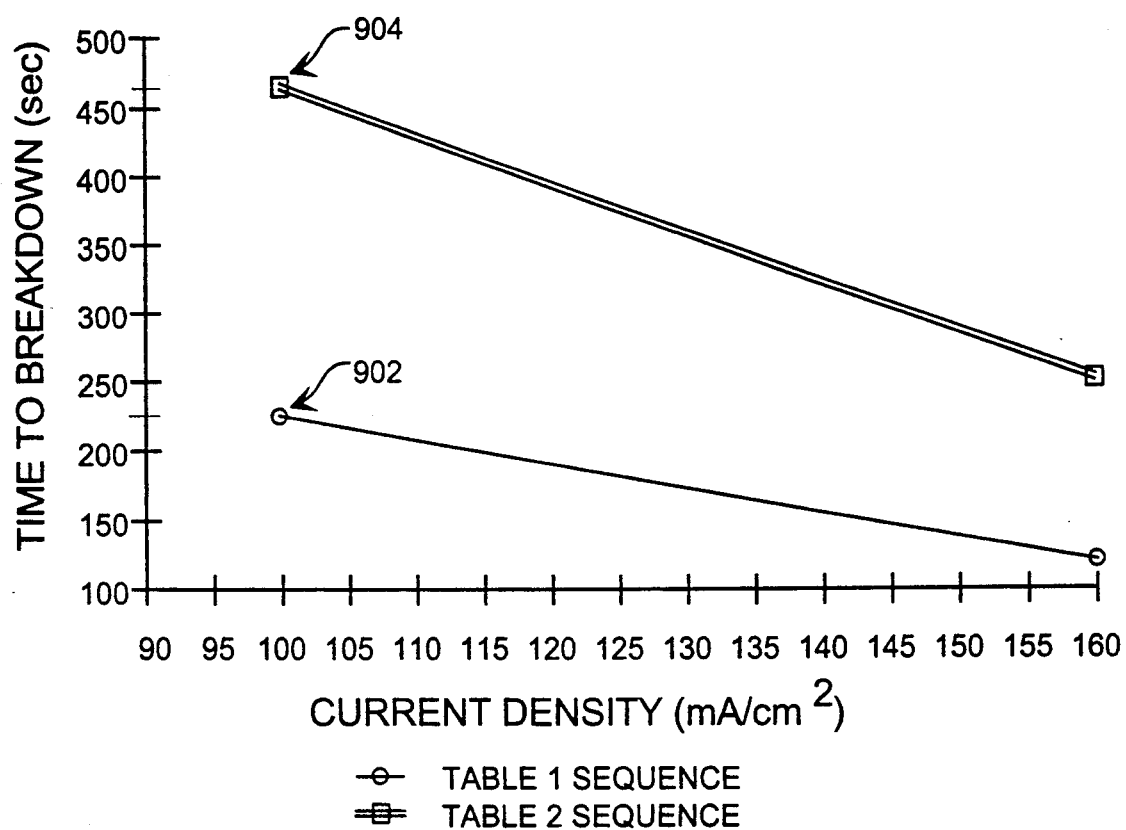
FIG. 9 is a chart which plots time-to-breakdown measurements for two different tunnel oxides fabricated over an N+ region according to the process sequence of FIGS. 1-7.

FIG. 9 shows a plot of time-to-breakdown versus current density for two different tunnel oxides fabricated upon the semiconductor surface overlying an N+ layer. This region corresponds to the region of an EEPROM cell where the programming occurs. At two different current densities, a tunnel oxide fabricated using the sequence of Table 1 and a tunnel oxide fabricated using the sequence of Table 2 were each measured for time-to-breakdown. A near 100% improvement was observed at both current densities. For example, at a current density of 100 mA/cm$^2$, the measured time-to-breakdown was 230 seconds for the tunnel oxide fabricated using the sequence of Table 1 (data point 902), and yet improved to 470 seconds for the tunnel oxide fabricated using the sequence of Table 3 (data point 904).

Figure 10:
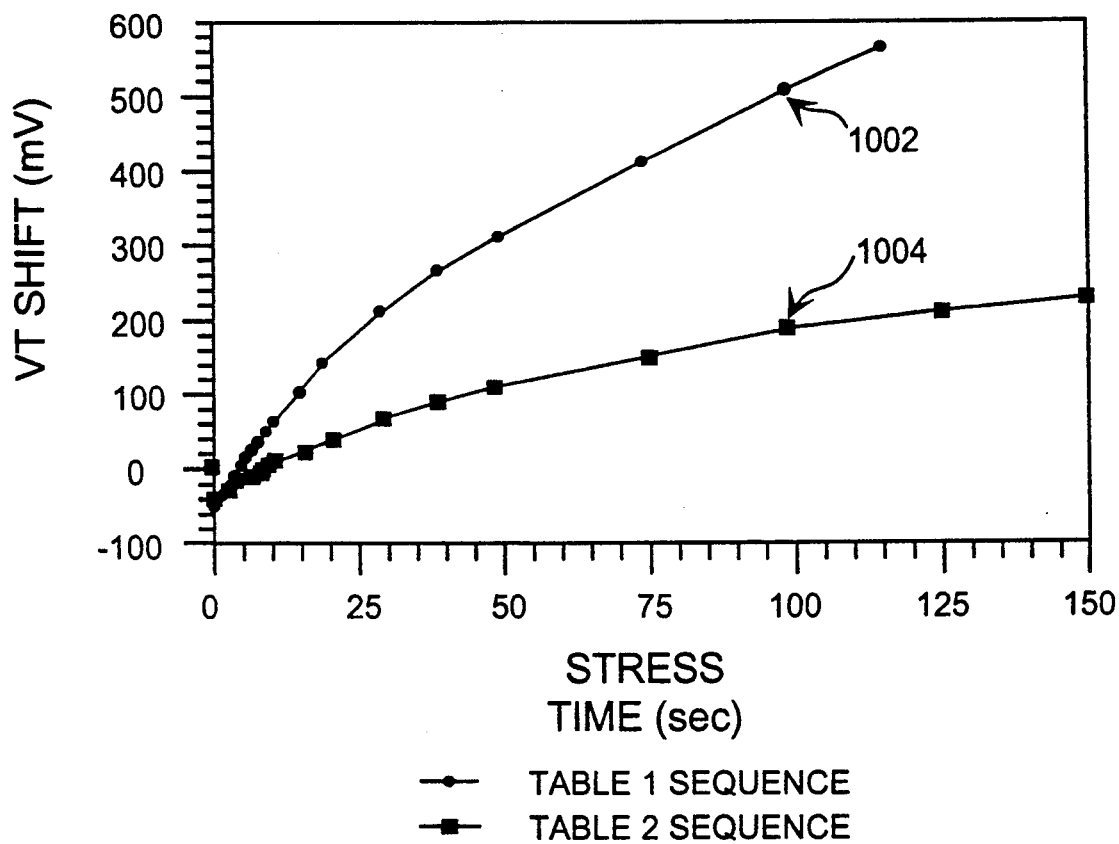
FIG. 10 is a chart which plots $V_T$ shift versus stress time for two different gate oxides fabricated over a P-substrate region according to the process sequence of FIGS. 1-7.

A further example of the improvements in the charge trapping properties achievable using the oxidation sequence of Table 2 can be appreciated by measuring the shift in threshold voltage as a function of current through the oxide. FIG. 10 shows a plot of the change in threshold voltage ($V_T$ shift) versus time, for a fixed oxide current density of 100 mA/cm$^2$. This structure corresponds to the channel region of a transistor. For a 100 second duration of oxide current, the $V_T$ shift is 505 mV for the oxidation sequence of Table 1 (data point 1002). However, for the same 100 second duration of oxide current, the $V_T$ shift is only 180 mV for a transistor fabricated using a process flow including the oxidation sequence of Table 2 (data point 1004), representing a 200% improvement in the charge stability of the oxide. Since the threshold voltage of a MOS transistor incorporates all charges (oxide, polysilicon/oxide interface, and silicon/oxide interface), the data shown in FIG. 10 clearly demonstrate the superior ability to reduce unwanted stray charge in a tunnel oxide fabricated using the oxidation sequence of Table 2.

It is believed that the quality improvement, as represented by the Time-to-Breakdown data shown in FIGS. 8-9, to both tunnel oxides and gate oxides as a result of the tunnel oxidation sequence as described in Table 2, is due to the charge stability in the Si/SiO$_2$ interface, the poly-silicon/SiO$_2$ interface, and throughout the gate oxide and tunnel oxide region afforded by the presence of nitrogen in the tunnel and gate oxides.

The technique thus described results in a 100% improvement in $Q_{BD}$ or Time-to-Breakdown characteristics of a tunnel oxide for an EEPROM process, and a 200% improvement in charge stability in the channel region of a transistor. The technique has far reaching implications for any oxidation cycle prior to polysilicon deposition for improving oxide quality, and has tremendous potential application to all MOS process technologies.

It is believed that the technique described is particularly suited to improving the quality of deposited oxides and, as illustrated in the sequence of FIG. 1–7 in forming the gate oxide, for re-grown oxides. A deposited oxide is potentially useful for forming a tunnel oxide less than 50 Å thick, rather than growing the oxide as discussed above. Alternatively, the sequence of Table 2, with the oxidation time of step III reduced to 2–3 minutes, can be used to form an oxide of approximately 50 Å.

It is also believed that a concentration of nitrogen in the oxide provides a diffusion barrier to reduce the migration of dopant atoms, particularly boron, from an overlying polysilicon layer down through the oxide to the channel or substrate region below the oxide, which could degrade the performance of a device using the oxide (by significantly altering the doping profile of the substrate region). This diffusion barrier is particularly attractive when boron is present, because boron diffuses through oxide faster than either phosphorus or arsenic.

A source of nitrogen in the oxide layer can be provided by the N$_2$O anneal as described above, or alternatively by other gases, such as NH$_3$, NH$_4$, or NF$_3$, typically in combination with a source of oxygen, such as O$_2$.

Furthermore, the nitrogen can be introduced earlier in the oxidation process than a final anneal. For example, it is believed that nitrogen may be introduced during the gettering operations, and yield an oxide having similar quality improvements as the oxides discussed above, even if the final anneal is only under an inert ambient. The nitrogen may also be introduced during some or all of the growth steps themselves, albeit requiring re-calibration of the optimal growth conditions necessary to yield an oxide of the desired thickness.

While the above descriptions reference an EEPROM technology fabricated in a CMOS technology, the teachings of this disclosure can be advantageously applied to other semiconductor process technologies incorporating thin oxides. For example, a DRAM process requiring capacitors fabricated with very thin oxide dielectrics could benefit greatly from these teachings.

While the invention has been described with respect to the embodiments set forth above, the invention is not necessarily limited to these embodiments. For example, the invention is not necessarily limited to any particular transistor process technology. Moreover, variations in certain of the process steps can be practiced. For example, the gate oxide etching step, which reduces the thickness of the previously grown gate oxide from 225 Å down to 140 Å, can be eliminated if the implant energies are adjusted to accommodate a thinner "implant oxide". Accordingly, other embodiments, variations, and improvements not described herein are not necessarily excluded from the scope of the invention, which is defined by the following claims.

We claim:

1. In an integrated circuit fabrication process, a method for forming a high quality oxide upon a surface region of a semiconductor body, comprising the steps of:

oxidizing the semiconductor body a first time, under an oxidizing ambient, to form a first oxide layer upon the surface region;

annealing the semiconductor body a first time subsequent to the first oxidizing step, under a gettering ambient, to densify the first oxide layer and to dope the first oxide layer at its surface and for a portion thereinto near its surface with a gettering agent;

oxidizing the semiconductor body a second time, under an oxidizing ambient, to form a second oxide layer upon the first oxide layer, subsequent to the first annealing step; and annealing the semiconductor body a second time, under an oxidizing ambient containing nitrogen, thereby forming a third oxide layer upon the second oxide layer, the third oxide layer containing a concentration of nitrogen;

wherein the first, second, and third oxide layers together form a high quality oxide.

2. A method as in claim 1 wherein the second annealing step is performed under an N$_2$O ambient environment.

3. A method as in claim 1 wherein the second annealing step is performed under an ambient environment including a gas chosen from the group consisting of NH$_3$, NH$_4$, and NF$_3$.

4. A method as in claim 2 wherein the second annealing step comprises a RTA annealing step.

5. A method as in claim 4 wherein the first annealing step is performed under an HCl/Ar ambient environment.

6. A method as in claim 5 wherein the first oxide layer annealing step is performed at a temperature of about 850° C.

7. A method as in claim 6 wherein the first and second oxidizing steps are performed at a temperature of about 850° C.

8. A method as in claim 7, further comprising the step of heavily doping a portion of the semiconductor body under the surface region of the semiconductor body prior to the first oxidizing step.

9. A method as in claim 8 further comprising, subsequent to the second oxidizing step and prior to the second annealing step, the steps of:
annealing the semiconductor body a third time, under a gettering ambient, to densify the second oxide layer and to dope the second oxide layer at its surface and for a portion thereinto near its surface with a gettering agent; and
oxidizing the semiconductor body a third time, under an oxidizing ambient, subsequent to the third annealing step, to form a fourth oxide layer upon the second oxide layer;
wherein the first, second, third, and fourth oxide layers together form a high quality oxide.

10. In an integrated circuit fabrication process suitable for EEPROM devices, a method for forming a high-quality tunnel oxide upon a surface region of a semiconductor body over a heavily-doped N+ layer therein, comprising the steps of:
forming a heavily-doped N+ layer in the semiconductor body;
oxidizing the semiconductor body a first time, under an oxidizing ambient, subsequent to the N+ layer forming step, to form an oxide upon a surface region of the semiconductor body over the heavily-doped N+ layer;
annealing the semiconductor body a first time, under a gettering ambient, subsequent to the first oxidizing step, to densify the oxide and to dope the oxide at its surface and for a portion thereinto near its surface with a gettering agent;
oxidizing the semiconductor body a second time, under an oxidizing ambient, subsequent to the first annealing step, to thicken the oxide; and
annealing the semiconductor body for a second time, under an oxidizing ambient containing nitrogen, subsequent to the second oxidizing step, thereby further thickening the oxide and forming a surface layer therein containing a concentration of nitrogen.

11. A method as in claim 10 wherein the second annealing step is performed under an $N_2O$ ambient environment.

12. A method as in claim 10 wherein the second annealing step is performed under an ambient environment including a gas chosen from the group consisting of $NH_3$, $NH_4$, and $NF_3$.

13. A method as in claim 11 wherein the second annealing step comprises a RTA annealing step.

14. A method as in claim 13 wherein the first annealing step is performed under an HCl/Ar ambient environment.

15. A method as in claim 14 wherein the first annealing step is performed at a temperature of about 850° C.

16. A method as in claim 15 wherein the first and second oxidizing steps are performed at a temperature of about 850° C.

17. A method as in claim 16 further comprising, subsequent to the second oxidizing step and prior to the second annealing step, the steps of:
annealing the semiconductor body a third time, under a gettering ambient, to further densify the oxide and to dope the oxide at its surface and for a portion thereinto near its surface with a gettering agent; and
oxidizing the semiconductor body a third time, under an oxidizing ambient, subsequent to the third annealing step, to further thicken the oxide.

18. In an integrated circuit fabrication process suitable for EEPROM devices, a method for forming a tunnel oxide upon a first surface region of a semiconductor body over a heavily-doped N+ layer, and further for forming a gate oxide, of greater thickness than the tunnel oxide, upon a second surface region of the semiconductor body, comprising the steps of:
growing a first oxide upon the first surface region of the semiconductor body over the heavily-doped N+ layer, and upon the second surface region of the semiconductor body;
removing a region of the first oxide, to expose a surface of the semiconductor body over the heavily-doped N+ layer, and leaving a remaining region of the first oxide;
oxidizing the semiconductor body to form a tunnel oxide on the exposed surface of the semiconductor body while re-oxidizing the remaining region of the first oxide to form the gate oxide; and
annealing the semiconductor body a first time, under an oxidizing ambient containing nitrogen, to further thicken the tunnel oxide and gate oxide and to form a surface layer each therein containing a concentration of nitrogen.

19. A method as in claim 18 wherein the oxidizing step comprises the steps of:
oxidizing the semiconductor body a first time, under an oxidizing ambient, to form an oxide upon the surface region;
annealing the semiconductor body a second time, under a gettering ambient, subsequent to the first oxidizing step, to densify the oxide and to dope the oxide at its surface and for a portion thereinto near its surface with a gettering agent; and
oxidizing the semiconductor body a second time, under an oxidizing ambient, subsequent to the second annealing step, to thicken the oxide.

20. A method as in claim 19 wherein the first annealing step is performed under an $N_2O$ ambient environment.

21. A method as in claim 19 wherein the first annealing step is performed under an ambient environment including a gas chosen from the group consisting of $NH_3$, $NH_4$, and $NF_3$.

22. A method as in claim 20 wherein the first annealing step comprises an RTA annealing step.

23. A method as in claim 22 wherein the second annealing step is performed under an HCl/Ar ambient environment.

24. A method as in claim 23 wherein the second annealing step is performed at a temperature of about 850° C.

25. A method as in claim 24 wherein the first and second oxidizing steps are performed at a temperature of about 850° C.

* * * * *